US010332981B1

(12) United States Patent
Lin et al.

(10) Patent No.: US 10,332,981 B1
(45) Date of Patent: Jun. 25, 2019

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yu-Ying Lin, Tainan (TW); Yi-Liang Ye, Kaohsiung (TW); Sung-Yuan Tsai, Yunlin County (TW); Chun-Wei Yu, Tainan (TW); Yu-Ren Wang, Tainan (TW); Zhen Wu, Kaohsiung (TW); Tai-Yen Lin, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/943,657

(22) Filed: Apr. 2, 2018

(30) Foreign Application Priority Data

Mar. 8, 2018 (CN) .......................... 2018 1 0188894

(51) Int. Cl.
| | |
|---|---|
| *H01L 21/00* | (2006.01) |
| *H01L 29/66* | (2006.01) |
| *H01L 21/265* | (2006.01) |
| *H01L 21/3065* | (2006.01) |
| *H01L 21/306* | (2006.01) |
| *H01L 21/768* | (2006.01) |
| *H01L 29/78* | (2006.01) |
| *H01L 29/08* | (2006.01) |
| *H01L 21/285* | (2006.01) |
| *H01L 21/02* | (2006.01) |

(52) U.S. Cl.
CPC .. *H01L 29/66636* (2013.01); *H01L 21/26506* (2013.01); *H01L 21/28587* (2013.01); *H01L 21/3065* (2013.01); *H01L 21/30604* (2013.01); *H01L 21/76843* (2013.01); *H01L 21/76855* (2013.01); *H01L 29/0847* (2013.01); *H01L 29/7848* (2013.01); *H01L 21/02631* (2013.01); *H01L 21/2855* (2013.01); *H01L 21/28518* (2013.01)

(58) Field of Classification Search
CPC ........... H01L 21/02857; H01L 21/2855; H01L 21/02631; H01L 21/2018
See application file for complete search history.

(56) References Cited

U.S. PATENT DOCUMENTS

| | | | |
|---|---|---|---|
| 8,377,785 B2 * | 2/2013 | Dyer ................. | H01L 21/30608 257/19 |
| 8,623,713 B2 * | 1/2014 | Aquilino ........... | H01L 21/76232 257/190 |

(Continued)

OTHER PUBLICATIONS

Chien, Title of Invention: Method for Manufacturing Finfet Semiconductor Device, U.S. Appl. No. 14/279,340, filed May 16, 2014.

(Continued)

*Primary Examiner* — Nicholas J Tobergte
(74) *Attorney, Agent, or Firm* — Winston Hsu

(57) ABSTRACT

A method for fabricating semiconductor device includes the steps of: forming a first gate structure on a substrate; performing a first etching process to form a recess adjacent to the first gate structure; performing an ion implantation process to form an amorphous layer directly under the recess; performing a second etching process to remove the amorphous layer; and forming an epitaxial layer in the recess.

7 Claims, 3 Drawing Sheets

(56) References Cited

U.S. PATENT DOCUMENTS

| | | | | |
|---|---|---|---|---|
| 9,349,862 B2* | 5/2016 | Zhang | ............... | H01L 21/26506 |
| 9,449,834 B2* | 9/2016 | Wei | ................... | H01L 21/26533 |
| 9,741,855 B2* | 8/2017 | Shin | ................. | H01L 29/66568 |
| 9,768,300 B2* | 9/2017 | Shin | ..................... | H01L 29/4966 |
| 10,002,967 B2* | 6/2018 | Hong | .................. | H01L 29/0611 |
| 10,141,443 B2* | 11/2018 | Hsia | .................. | H01L 29/66818 |
| 2014/0141589 A1* | 5/2014 | Shin | .................. | H01L 29/66568 |
| | | | | 438/306 |
| 2015/0011070 A1* | 1/2015 | Kim | .................. | H01L 29/66636 |
| | | | | 438/300 |
| 2015/0179654 A1* | 6/2015 | Mehrotra | ............ | H01L 27/1104 |
| | | | | 257/77 |
| 2015/0303283 A1* | 10/2015 | Chien | ............... | H01L 29/66803 |
| | | | | 438/478 |
| 2016/0064523 A1* | 3/2016 | Adam | ............... | H01L 29/66636 |
| | | | | 438/198 |
| 2016/0218214 A1* | 7/2016 | Kim | ................... | H01L 21/0243 |
| 2017/0098708 A1* | 4/2017 | Shen | .................. | H01L 29/7848 |

OTHER PUBLICATIONS

Yeh, Title of Invention: Manufacturing Method of Semiconductor Device, U.S. Appl. No. 15/803,865, filed Nov. 6, 2017.

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for forming epitaxial layer adjacent to a gate structure.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

However, epitaxial layers serving as primary stress-inducing structure in planar and non-planar metal-oxide semiconductor (MOS) transistors today are difficult to obtain satisfactory stress through the fabrication process, thereby affecting the performance of the device. Hence, how to improve the current fabrication to resolve this issue has become an important task in this field.

SUMMARY OF THE INVENTION

According to an embodiment of the present invention, a method for fabricating semiconductor device includes the steps of: forming a first gate structure on a substrate; performing a first etching process to form a recess adjacent to the first gate structure; performing an ion implantation process to form an amorphous layer directly under the recess; performing a second etching process to remove the amorphous layer; and forming an epitaxial layer in the recess.

According to another aspect of the present invention, a semiconductor device includes: a first gate structure and a second gate structure on a substrate; an epitaxial layer adjacent to the first gate structure; and a bump on the substrate adjacent to the first gate structure and directly under the epitaxial layer.

Preferably, a top surface of the bump includes a planar surface and two inclined sidewalls, the bump is between the first gate structure and the second gate structure, the epitaxial layer comprises a first V-shape under the first gate structure and a second V-shape under the second gate structure, the first V-shape and the second V-shape are connected to the two inclined sidewalls directly, and the bump and the substrate comprise same material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
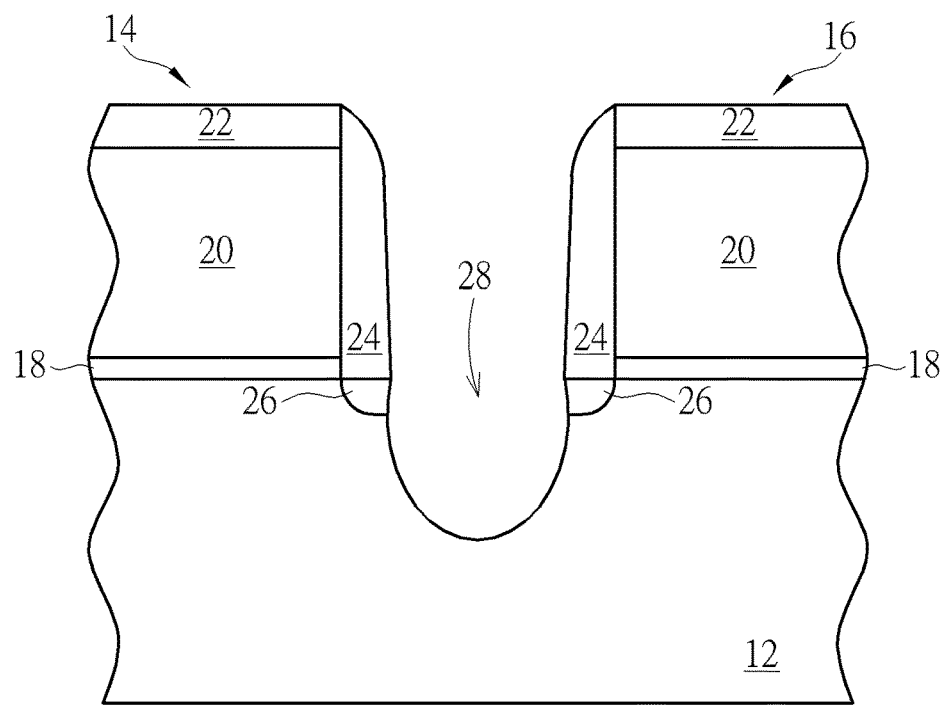
FIGS. 1-6 illustrate a method for fabricating semiconductor device according to an embodiment of the present invention.

Referring to FIGS. 1-6, FIGS. 1-6 illustrate a method for fabricating semiconductor device according to an embodiment of the present invention. As shown in FIG. 1, a substrate 12 is provided and gate structures 14, 16 are formed on the substrate 12. In this embodiment, the formation of the gate structures 14, 16 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, gate structures 14, 16 each made of a patterned gate dielectric layer 18, a patterned gate material layer 20, and a patterned hard mask 22 are formed on the substrate 12.

It should be noted that even though two gate structures 14, 16 are disclosed in this embodiment, the quantity or number of the gate structures 14, 16 is not limited to two, but could all be adjusted according to the demand of the product. Moreover, only part of the gate structures 14, 16, such as the right portion of the gate structure 14 and left portion of the gate structure 16 are shown in FIG. 1 to emphasize the formation of epitaxial layer between gate structures 14, 16 in the later process.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 18 could include $SiO_2$, SiN, or high-k dielectric material; the gate material layer 20 could include metal, polysilicon, or silicide; and the material of the hard mask 22 could be selected from the group consisting of $SiO_2$, SiN, SiC, and SiON.

In an embodiment of the present invention, a plurality of doped wells or shallow trench isolations (STIs) could be selectively formed in the substrate 12. Despite the present invention pertains to a planar MOS transistor, it would also be desirable to apply the process of the present invention to fabricate non-planar transistors such as FinFET devices, and in such instance, the substrate 12 shown in FIG. 1 would become a fin-shaped structure formed atop a substrate 12.

Next, at least one spacer 24 is formed on the sidewalls of each of the gate structures 14 and 16. Optionally, after a lightly doped ion implantation processes is conducted, a rapid thermal annealing processes is performed at about 930° C. to active the dopants implanted in the substrate 12 for forming a lightly doped drain 26 in the substrate 12 adjacent to two sides of the spacer 24. In this embodiment, the spacer 24 could be a single or composite spacer, in which the spacer 24 could further include an offset spacer (not shown) and a main spacer (not shown). The offset spacer and the main spacer are preferably made of different material while the offset spacer and main spacer could all be selected from the group consisting of $SiO_2$, SiN, SiON, and SiCN, but not limited thereto.

Next, a first etching process or preferably a dry etching process is conducted by using the gate structures 14, 16 and spacers 24 as mask to remove part of the substrate 12. This forms a recess 28 in the substrate 12 adjacent to the gate structures 14, 16 or more specifically forms a recess 28 adjacent to two sides of the gate structure 14 and a recess 28 adjacent to two sides of the gate structure 16. It should be noted that in order to emphasize the change in the shape of the recess 28 and the profile of the epitaxial layer formed in the later process, only the a recess 28 between the gate structures 14, 16 is shown in this embodiment.

Figure 2:
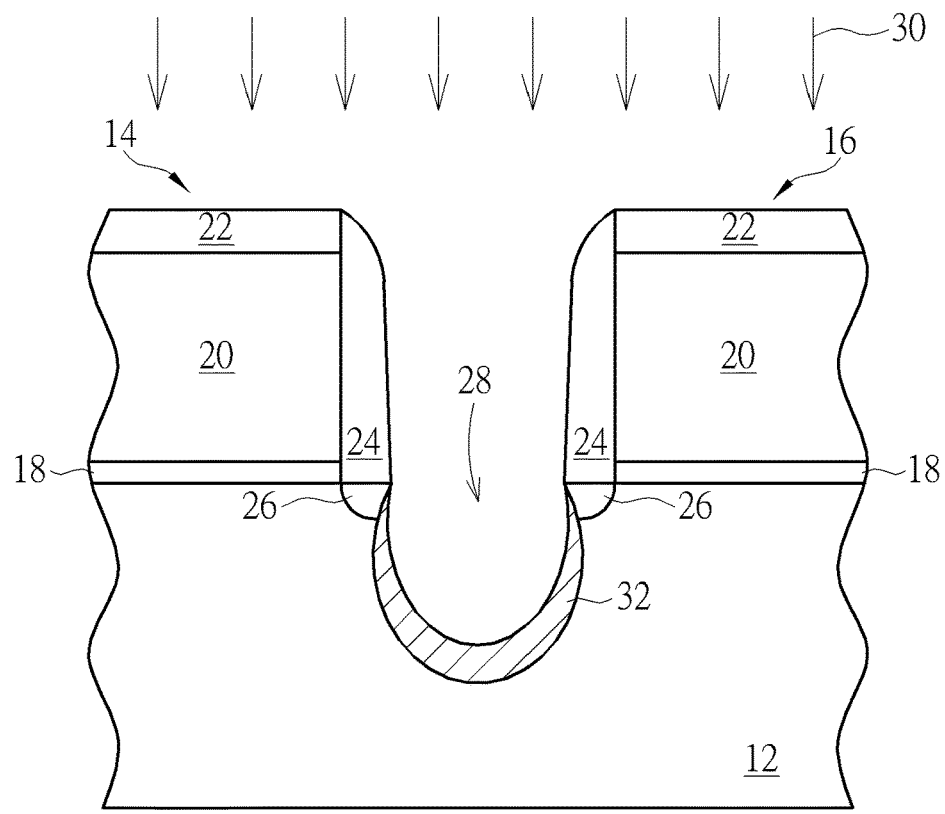

Next, as shown in FIG. 2, an ion implantation process 30 is conducted by implanting ions into the substrate 12 directly under the recess 28 to form an amorphous layer 32. Specifically, the formation of the amorphous layer 32 at this stage is accomplished by transforming part of the substrate 12 that was originally made of single crystal silicon into amorphized or amorphous structure such as the amorphous layer 32 through ion implantation process 30. In this embodiment, the ions implanted by the ion implantation process 30 are selected from the group consisting of arsenic (As), germanium (Ge), and phosphorus (P). Preferably, the energy of the ion implantation process 30 is preferably between 5 KeV to 25 KeV and the concentration of the ion implantation process 30 is between $1 \times 10^{14}$ ions/cm$^2$ to $5 \times 10^{15}$ ions/cm$^2$ or most preferably between $6 \times 10^{14}$ ions/cm$^2$ to $7 \times 10^{14}$ ions/cm$^2$.

Figure 3:
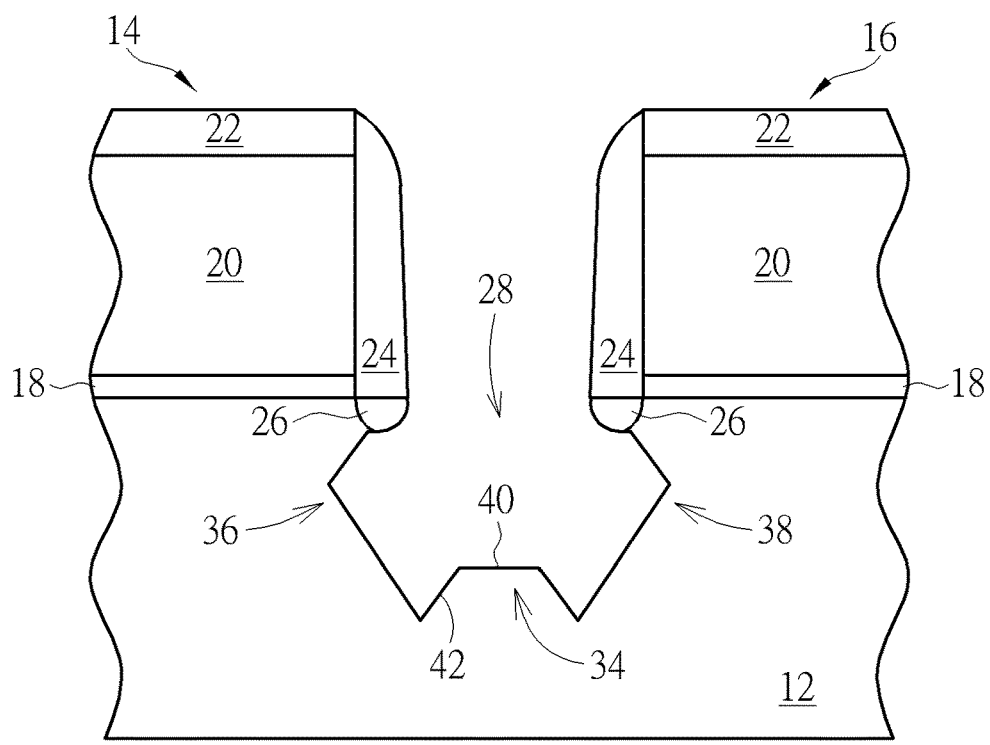

Next, as shown in FIG. 3, a second etching process is conducted to remove the amorphous layer 32 and even part of the substrate 12 made of single crystal silicon surrounding the amorphous layer 32 to form a bump 34 on the substrate 12 directly under the recess 28. In this embodiment, the second etching process is preferably a wet etching process utilizing etchant such as ammonium hydroxide (NH$_4$OH) preferably without the addition of tetramethylammonium hydroxide (TMAH) and the temperature of the wet etching process is preferably between 45° C. to 55° C. or most preferably at around 50° C.

It is to be noted that when the amorphous layer 32 is removed by the aforementioned second etching process or wet etching process, the shape of the original recess 28 is slightly altered while a bump 34 is formed on the substrate 12 between the gate structure 14 and the gate structure 16 at the same time. Specifically, the newly formed recess 28 at this stage preferably includes a first V-shape 36 under the gate structure 14 and a second V-shape 38 under the gate structure 16, the bump 34 includes a planar top surface 40 and two inclined sidewalls 42, and the first V-shape 36 and second V-shape 38 of the recess 28 are connected and directly contacting the two inclined sidewalls 42 of the bump 34 from the left and right sides.

Figure 4:
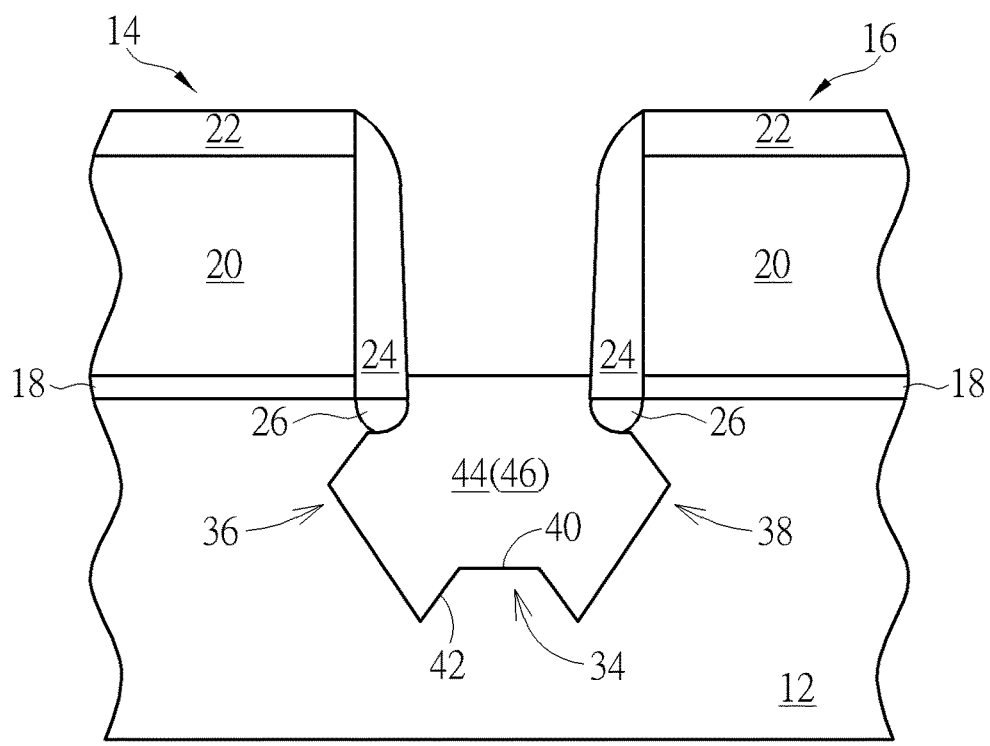

Next, as shown in FIG. 4, a selective buffer layer (not shown) could be formed in the recess 28, and then a selective epitaxial growth (SEG) process is conducted to form an epitaxial layer 44 in the recess 28 serving as source/drain region 46. In this embodiment, a top surface of the epitaxial layer 44 is slightly higher than a top surface of the substrate 12 and the epitaxial layer 44 also shares substantially same cross-section shape with the recess 28. In this embodiment, the epitaxial layer 44 could also be formed to include different material depending on the type of transistor being fabricated. For instance, if the MOS transistor being fabricated were to be a PMOS transistor, the epitaxial layer 44 could be made of material including but not limited to for example SiGe, SiGeB, or SiGeSn. If the MOS transistor being fabricated were to be a NMOS transistor, the epitaxial layer 44 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layer 44 is preferred to have less or no germanium atom at all to facilitate the formation of silicide afterwards. It should be noted that even though the top surface of the epitaxial layer 44 is slightly higher than the top surface of the substrate 12 in this embodiment, the top surface of the epitaxial layer 44 could also be even with the top surface of the substrate 12 according to another embodiment of the present invention.

Figure 5:
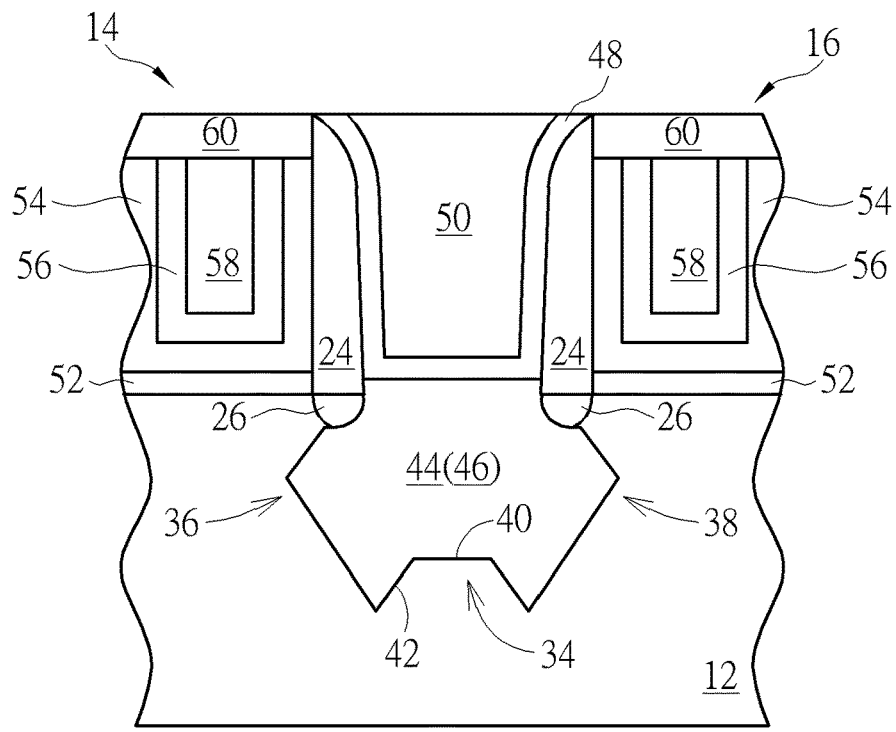

Next, as shown in FIG. 5, a contact etch stop layer (CESL) 48 preferably made of silicon nitride is formed on the substrate 12 to cover the gate structures 14, 18 and the epitaxial layer 44, and an interlayer dielectric (ILD) layer 50 is formed on the CESL 48. Next, a planarizing process such as a chemical mechanical polishing (CMP) process is conducted to remove part of the ILD layer 50 and part of the CESL 48 so that the top surfaces of the hard mask 22 and the ILD layer 50 are coplanar.

Next, a replacement metal gate (RMG) process is conducted to transform the gate structures 14, 16 into metal gates. For instance, the RMG process could be accomplished by first performing a selective dry etching or wet etching process, such as using etchants including but not limited to for example ammonium hydroxide (NH$_4$OH) or tetramethylammonium hydroxide (TMAH) to remove the hard mask 22 and the gate material layer 20 or even gate dielectric layer 18 from gate structures 14, 16 for forming recesses (not shown) in the ILD layer 50.

Next, a selective interfacial layer 52 or gate dielectric layer (not shown), a high-k dielectric layer 54, a work function metal layer 56, and a low resistance metal layer 58 are formed in the recesses, and a planarizing process such as CMP is conducted to remove part of low resistance metal layer 58, part of work function metal layer 56, and part of high-k dielectric layer 54 to form gate structures 14, 16 made of metal gates. In this embodiment, each of the gate structures 14, 16 or metal gates fabricated through high-k last process of a gate last process preferably includes an interfacial layer 52 or gate dielectric layer, a U-shaped high-k dielectric layer 54, a U-shaped work function metal layer 56, and a low resistance metal layer 58.

In this embodiment, the high-k dielectric layer 54 is preferably selected from dielectric materials having dielectric constant (k value) larger than 4. For instance, the high-k dielectric layer 54 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 56 is formed for tuning the work function of the metal gate in accordance with the conductivity of the device. For an NMOS transistor, the work function metal layer 56 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 56 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 56 and the low resistance metal layer 58, in which the material of the barrier layer may include titanium (Ti), titanium nitride (TiN), tantalum (Ta) or tantalum nitride (TaN). Furthermore, the material of the low-resistance metal layer 58 may include copper (Cu), aluminum (Al), titanium aluminum (TiAl), cobalt tungsten phosphide (CoWP) or any combination thereof. Next, part of the high-k dielectric layer 54, part of the work function metal layer 56, and part of the low resistance metal layer 58 could be removed to form a recess (not shown) on each of the gate structures 14, 16, and hard masks 60 are then formed into the recesses accompanied by another planarizing process conducted afterwards so that the top surfaces of the hard masks 60 and the ILD layer 50 are coplanar. Preferably, the hard masks 60 could be selected from the group consisting of $SiO_2$, SiN, SiC, and SiON.

Figure 6:
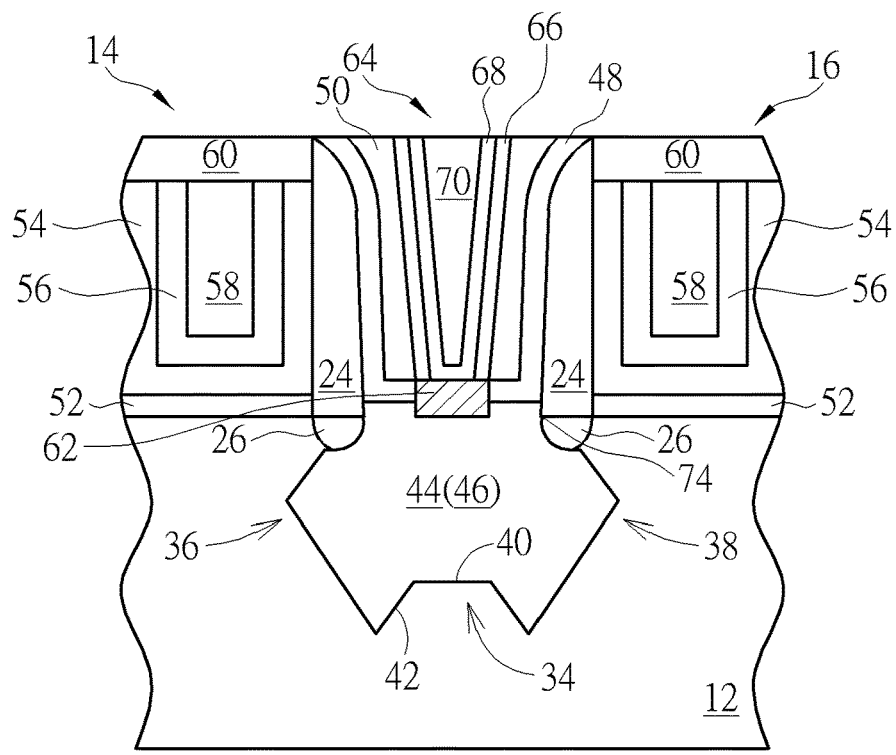

Next, as shown in FIG. 6, a contact plug formation is conducted along with a salicide process to form a silicide 62 on the surface of the epitaxial layer 44 and contact plugs 64 electrically connected to the epitaxial layer 44 or source/drain regions 46 adjacent to two sides of the gate structures 14, 16. In this embodiment, the contact plug formation could be accomplished by first conducting an etching process to remove part of the ILD layer 50 adjacent to the gate structures 14, 16 for forming contact holes (not shown) exposing the surface of the epitaxial layer 44. Next, a first metal layer 66 and a second metal layer 68 are deposited in sequence in the contact holes, in which the first metal layer 66 and the second metal layer 68 are formed conformally on the surface of the epitaxial layer 44 and inner sidewalls of the contact holes. In this embodiment, the first metal layer 66 is selected from the group consisting of Ti, Co, Ni, and Pt, and most preferably Ti, and the second metal layer 68 is selected from the group consisting of TiN and TaN.

After depositing the first metal layer 66 and second metal layer 68, a first thermal treatment process and a second thermal treatment process are conducted sequentially to form a silicide 62 on the epitaxial layer 44. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

After the two thermal treatment processes are conducted, a third metal layer 70 is deposited to fill the contact holes completely. In this embodiment, the third metal layer 70 is preferably composed of tungsten, but not limited thereto. Next, a planarizing process such as a CMP process is conducted to remove part of the third metal layer 70, part of the second metal layer 68, and part of the first metal layer 66, and depending on the demand of the process also removing part of the ILD layer 50 for forming contact plugs 64 electrically connected to the epitaxial layer 44. It is to be noted that contact plugs 64 are preferably formed adjacent to two sides of each of the gate structures 14, 16. Nevertheless for simplicity purpose, only a single contact plug 64 is shown in FIG. 6. This completes the fabrication of a semiconductor device according to a preferred embodiment of the present invention.

Referring again to FIG. 6, which further illustrates a structural view of a semiconductor device according to an embodiment of the present invention. As shown in FIG. 6, the semiconductor device includes gate structures 14, 16 disposed on the substrate 12, an epitaxial layer 44 adjacent to two sides (only shown on one side of each of the gate structures 14, 16 in FIG. 6) of the gate structures 14, 16, and a bump 34 on the substrate 12 between the gate structures 14, 16 and directly under the epitaxial layer 44.

Specifically, the bump 34 is essentially a part of the substrate 12 protruding upward thereby having same material as the substrate 12, in which the bump 34 includes a planar top surface 40 and two inclined sidewalls 42. The epitaxial layer 44 includes a first V-shape 36 under the gate structure 14 and a second V-shape 38 under the gate structure 16, in which the first V-shape 36 and the second V-shape 38 are connected and contacting the two inclined sidewalls 42 directly.

Overall, the present invention preferably conducts a first etching process (preferably a dry etching process) to remove part of the substrate adjacent to the gate structures to form a recess, and then performs an ion implantation process by implanting ions such as As, Ge, P, or combination thereof into the substrate directly under the recess for forming an amorphous layer. Next, a second etching process (preferably a wet etching process) is conducted to remove the amorphous layer and an epitaxial layer is formed in the recess thereafter. By following the aforementioned process the present invention is able to form an epitaxial layer having distinct shape, such as an epitaxial layer having a first V-shape under one side of the gate structure and a second V-shape under another side of the gate structure and these two V-shapes are directly connected to a bump under the epitaxial layer. Preferably, the epitaxial layer having this distinct outside exterior shape not only generates notably higher stress than conventional hexagonal or octagonal epitaxial structure, but also provides significantly greater volume so that the performance of the device could be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a first gate structure on a substrate;
    an epitaxial layer adjacent to the first gate structure; and
    a bump on the substrate adjacent to the first gate structure and directly under the epitaxial layer.

2. The semiconductor device of claim 1, wherein a top surface of the bump comprises a planar surface.

3. The semiconductor device of claim 1, wherein the bump comprises two inclined sidewalls.

4. The semiconductor device of claim 3, further comprising a second gate structure on the substrate, wherein the bump is between the first gate structure and the second gate structure.

5. The semiconductor device of claim 4, wherein the epitaxial layer comprises a first V-shape under the first gate structure and a second V-shape under the second gate structure.

6. The semiconductor device of claim 5, wherein the first V-shape and the second V-shape are connected to the two inclined sidewalls directly.

7. The semiconductor device of claim 1, wherein the bump and the substrate comprise same material.

* * * * *